(12) United States Patent
Seol

(10) Patent No.: US 11,799,143 B2
(45) Date of Patent: Oct. 24, 2023

(54) BATTERY PACK

(71) Applicant: SAMSUNG SDI CO., LTD., Yongin-si (KR)

(72) Inventor: Jihwan Seol, Yongin-si (KR)

(73) Assignee: SAMSUNG SDI CO., LTD., Yongin-si (KR)

(*) Notice: Subject to any disclaimer, the term of this patent is extended or adjusted under 35 U.S.C. 154(b) by 66 days.

(21) Appl. No.: 17/316,955

(22) Filed: May 11, 2021

(65) Prior Publication Data

US 2021/0351449 A1 Nov. 11, 2021

(30) Foreign Application Priority Data

May 11, 2020 (KR) .................. 10-2020-0056146

(51) Int. Cl.
*H01M 10/48* (2006.01)
*H01M 10/42* (2006.01)
*H05K 1/02* (2006.01)

(52) U.S. Cl.
CPC ....... *H01M 10/486* (2013.01); *H01M 10/425* (2013.01); *H05K 1/028* (2013.01); *H01M 2010/4271* (2013.01); *H05K 2201/10037* (2013.01)

(58) Field of Classification Search
CPC .. H01M 10/486; H01M 10/425; H05K 1/028; H05K 2201/10037
See application file for complete search history.

(56) References Cited

U.S. PATENT DOCUMENTS

| 5,472,804 | A | * | 12/1995 | Austin | ............... H01M 50/296 429/96 |
| 6,424,117 | B1 | * | 7/2002 | Vejraska | ............... H01M 50/50 320/112 |
| 9,024,572 | B2 | | 5/2015 | Nishihara et al. | |
| 9,196,887 | B2 | | 11/2015 | Sasada et al. | |
| 9,444,086 | B2 | | 9/2016 | Shimizu et al. | |
| 2010/0327815 | A1 | * | 12/2010 | Johnson | ............... H02J 7/0045 320/136 |

(Continued)

FOREIGN PATENT DOCUMENTS

| CN | 206505966 U | 9/2017 |
| JP | 2014-132585 A | 7/2014 |

(Continued)

OTHER PUBLICATIONS

Decision to Grant a Patent (Year: 2021).*
Korean Notice of Allowance dated Dec. 15, 2021.

*Primary Examiner* — Alexander Usyatinsky
(74) *Attorney, Agent, or Firm* — Lee IP Law, P.C.

(57) ABSTRACT

A battery pack including at least one battery cell including a first surface and a second surface forming opposite ends along a height direction thereof, and an outer circumferential surface connecting the first surface and the second surface; and a flexible circuit board configured to obtain state information of the at least one battery cell, the flexible circuit board including a corrugated main body at least partially surrounding the outer circumferential surface of the at least one battery cell, and branch portions extending from the main body onto the first surface or the second surface of the at least one battery cell.

16 Claims, 5 Drawing Sheets

(56) References Cited

U.S. PATENT DOCUMENTS

| | | | |
|---|---|---|---|
| 2015/0118530 A1* | 4/2015 | Lee .................. | H01M 10/6557 |
| | | | 429/82 |
| 2019/0027720 A1* | 1/2019 | Rejman .................. | B25F 5/006 |
| 2019/0312240 A1* | 10/2019 | Nikaido .............. | H01M 50/202 |
| 2022/0294067 A1* | 9/2022 | Wakabayashi ...... | H01M 50/284 |

FOREIGN PATENT DOCUMENTS

| | | |
|---|---|---|
| JP | 5621805 B2 | 11/2014 |
| JP | 2019-512154 A | 5/2019 |
| KR | 10-2012-0003432 A | 1/2012 |
| KR | 10-2015-0048501 A | 5/2015 |

* cited by examiner

BATTERY PACK

CROSS-REFERENCE TO RELATED APPLICATION

Korean Patent Application No. 10-2020-0056146, filed on May 11, 2020 in the Korean Intellectual Property Office, and entitled: "Battery Pack," is incorporated by reference herein in its entirety.

BACKGROUND

1. Field

Embodiments relate to a battery pack.

2. Description of the Related Art

In general, secondary batteries are batteries that can be charged and discharged, unlike primary batteries that cannot be charged. Secondary batteries may be used as energy sources for, e.g., mobile devices, electric vehicles, hybrid vehicles, electric bicycles, and uninterruptible power supplies. Secondary batteries may be used in the form of a single battery cell depending on the type of an external device to which the secondary battery is applied, or in the form of a battery pack in which a plurality of battery cells are connected and grouped into a single unit.

Small mobile devices, such as cellular phones, may operate for a certain period of time with the output and capacity of a single battery, but when long-term driving or high-power driving is required, like in electric vehicles and hybrid vehicles that consume a lot of power, battery packs may be preferred due to issues of output and capacity. The battery pack may increase the output voltage or output current according to the number of built-in battery cells.

SUMMARY

The embodiments may be realized by providing a battery pack including at least one battery cell including a first surface and a second surface forming opposite ends along a height direction thereof, and an outer circumferential surface connecting the first surface and the second surface; and a flexible circuit board configured to obtain state information of the at least one battery cell, the flexible circuit board including a corrugated main body at least partially surrounding the outer circumferential surface of the at least one battery cell, and branch portions extending from the main body onto the first surface or the second surface of the at least one battery cell.

The at least one battery cell may include a plurality of battery cells, and the corrugated main body of the flexible circuit board extends along outer circumferential surfaces of adjacent ones of the plurality of battery cells, and is configured to obtain temperature information from the outer circumferential surfaces of the plurality of battery cells.

The flexible circuit board may include a plurality of thermistors spaced apart from each other along an extension direction of the main body.

The branch portions may protrude from at least one side of the main body onto the first surface or the second surface of the at least one battery cell.

The branch portions may include a plurality of first branch portions spaced apart from each other and protruding from one side of the main body onto the first surface of the at least one battery cell; and a plurality of second branch portions spaced apart from each other and protruding from another side of the main body onto the second surface of the at least one battery cell.

The first and second branch portions may be laterally offset from each other along an extension direction of the main body.

The first and second branch portions may be vertically offset from each other.

Each of the first and second branch portions may be configured to obtain voltage information of the at least one battery cell from the first second surface and the second surface of the at least one battery cell.

The at least one battery cell may include a plurality of rows of battery cells that each extend lengthwise along a direction of long sides of a cell-containing region of the battery pack.

Battery cells in adjacent rows may be offset relative to each other.

The corrugated main body of the flexible circuit board may extend along outer circumferential surfaces of battery cells in adjacent rows and between opposite ends of the cell-containing region of the battery pack.

The main body of the flexible circuit board may extend from a first end to a second end of the cell-containing region of the battery pack along outer circumferential surfaces of the battery cells in two adjacent rows, may extend back from the second end to the first end of the cell-containing region of the battery pack along outer circumferential surfaces of the battery cells in two other adjacent rows, and may be bent in the form of a U-turn at the second end of the cell-containing region of the battery pack.

The main body of the flexible circuit board may extend along the direction of long sides of the cell-containing region of the battery pack.

The cell-containing region of the battery pack may be a region surrounded by an imaginary planar-sided envelope connecting the outer circumferential surfaces of the battery cells at an outer edge of the plurality of battery cells.

The direction of long sides of the cell-containing region of the battery pack may be an extension direction of imaginary planar-sided envelope surrounding the cell-containing region of the battery pack extending in a longest straight line form among imaginary planar sides of the envelope surrounding the cell-containing region.

The main body of the flexible circuit board may extend along a temperature gradient direction in which the temperature of the battery cell changes, among directions crossing the cell-containing region of the battery pack.

The main body of the flexible circuit board may extend along a temperature gradient direction in which the temperature of the battery cell changes to a maximum.

The main body of the flexible circuit board may be attached onto the outer circumferential surface of the battery cell with an adhesive member therebetween.

The adhesive member may include a double-sided tape.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
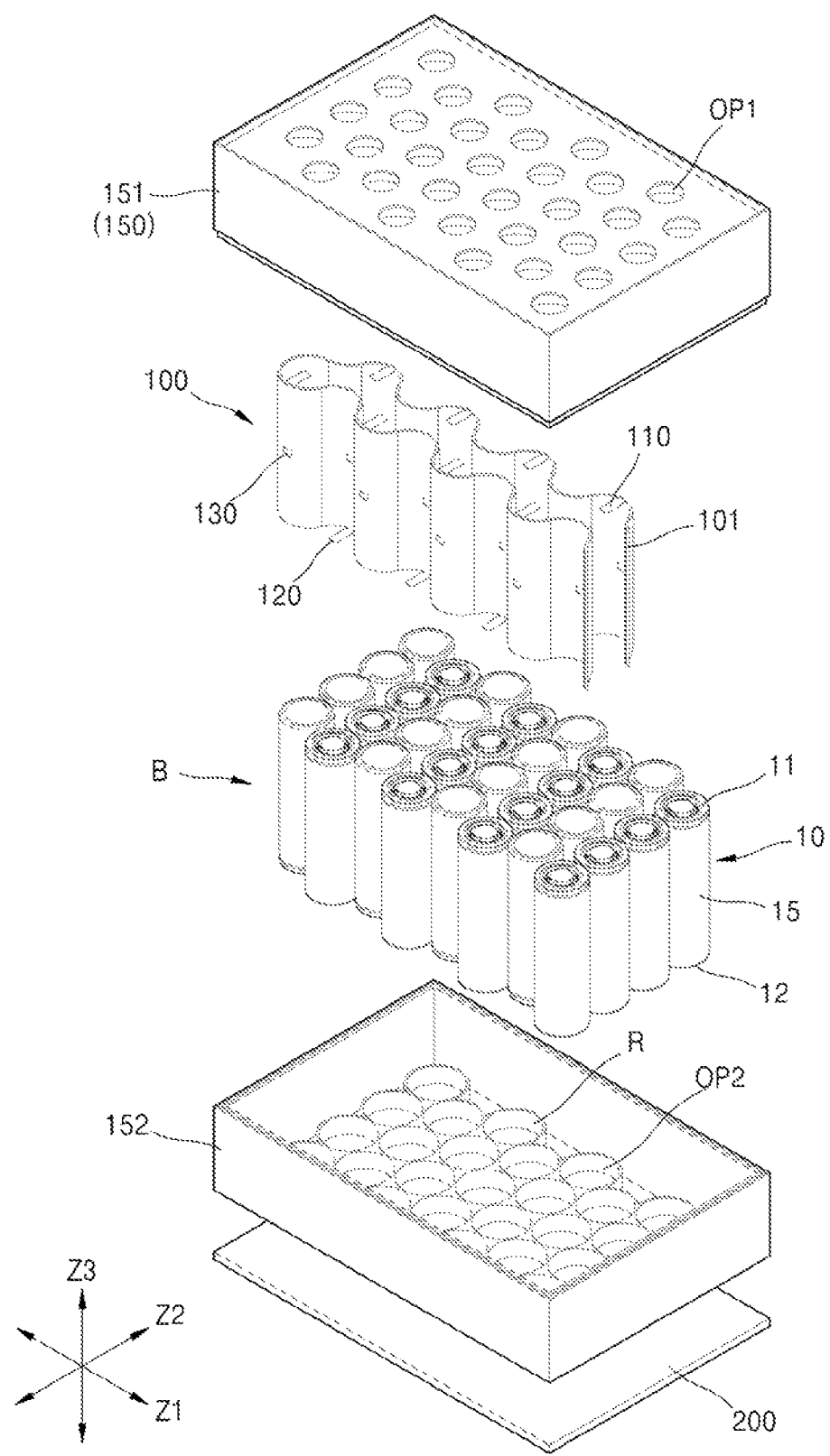
FIG. 1 is an exploded perspective view of a battery pack according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the terms "or" and "and/or" include any and all combinations of one or more of the associated listed items. Expressions such as "at least one of," when preceding a list of elements, modify the entire list of elements and do not modify the individual elements of the list.

Hereinafter, a battery pack according to an example embodiment of the present disclosure will be described with reference to the accompanying drawings.

Figure 2:
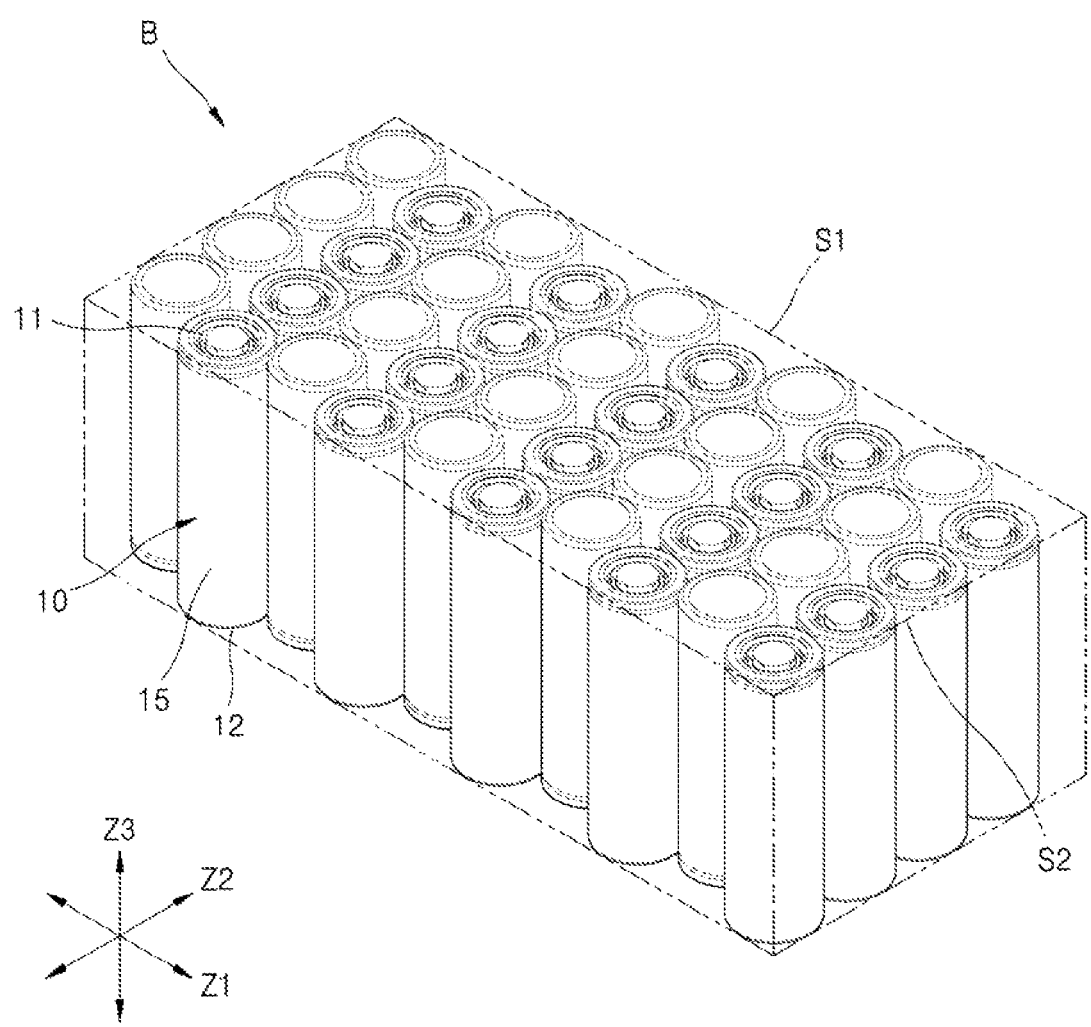
FIG. 2 is a perspective view of a cell region of FIG. 1.
Figure 3:
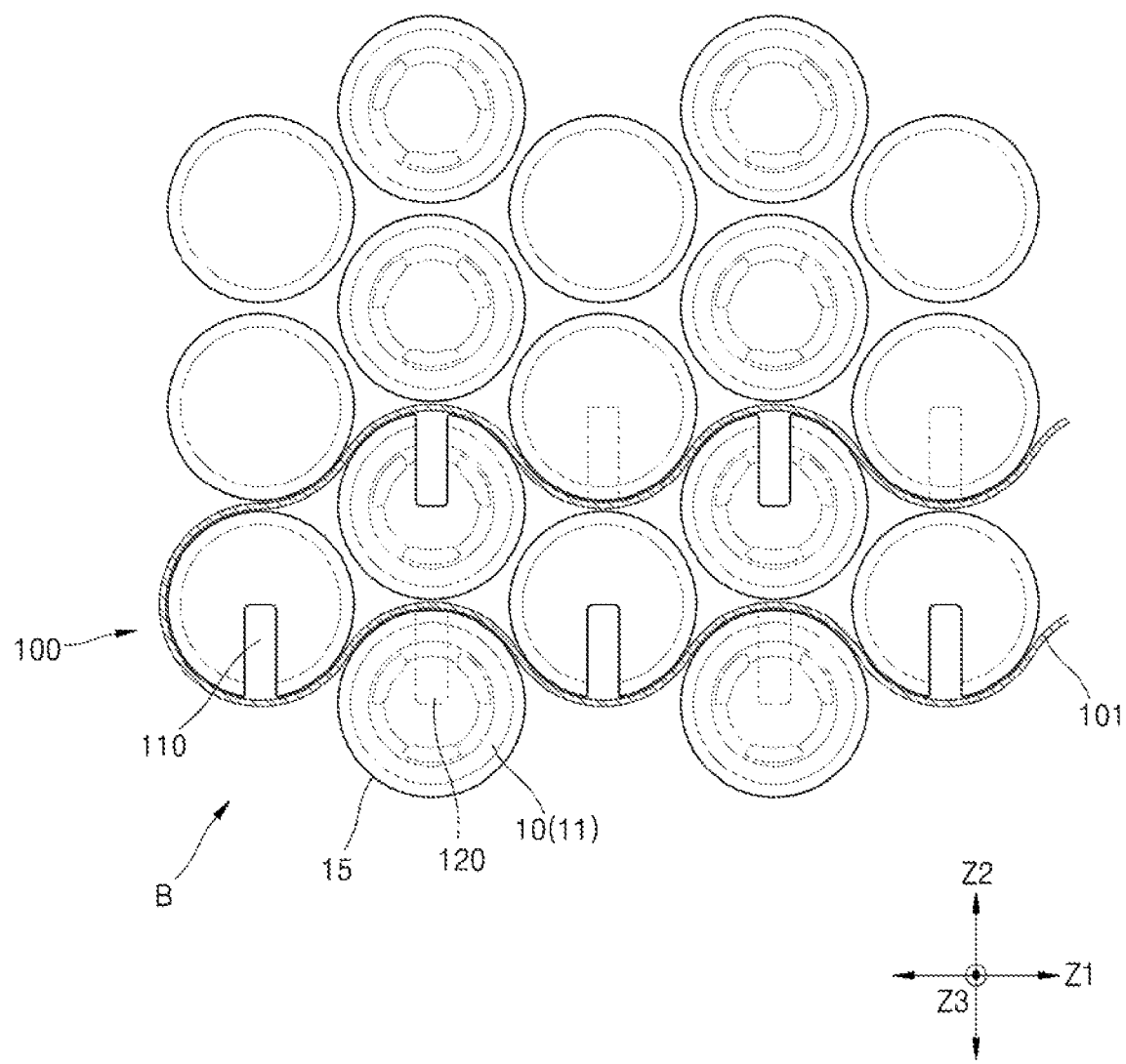
FIG. 3 is a view showing a trajectory of a flexible circuit board that extends across the cell region of FIG. 1.
Figure 4:
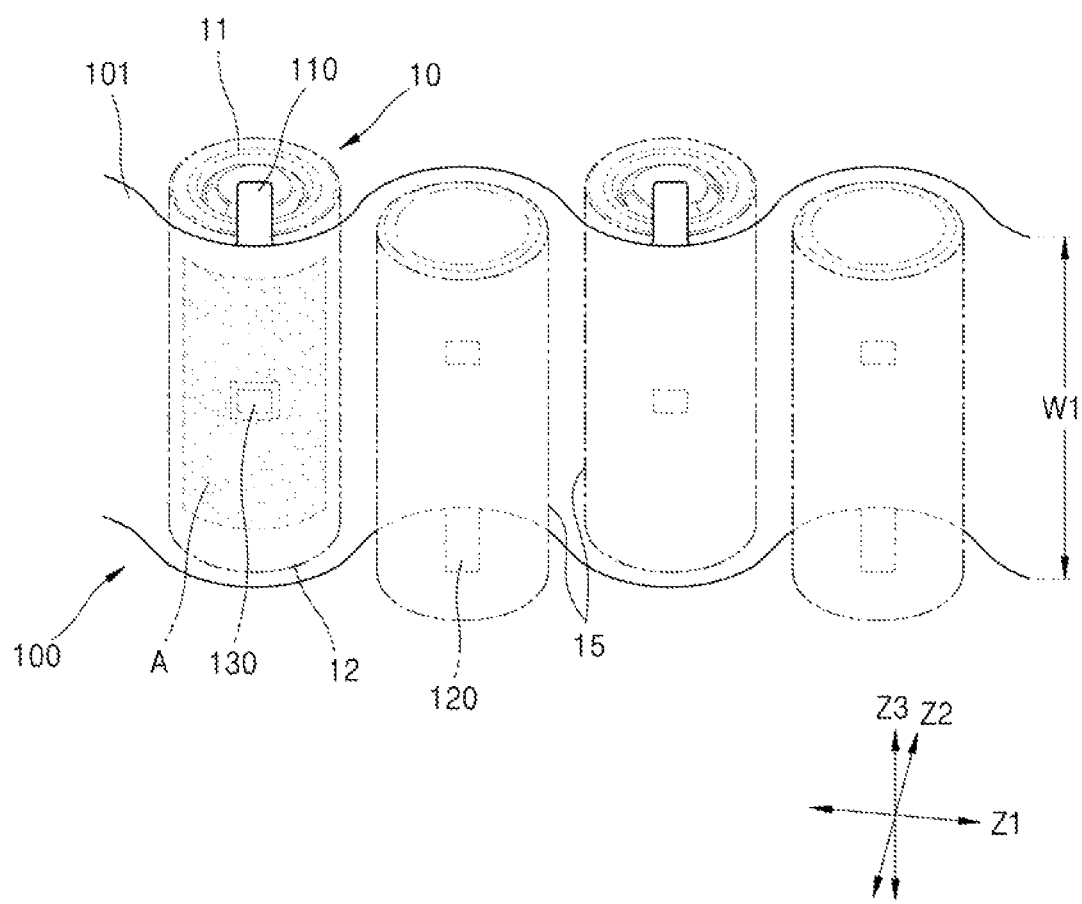
FIG. 4 is a perspective view showing the connection relationship between the flexible circuit board shown in FIG. 3 and a battery cell.
Figure 5:
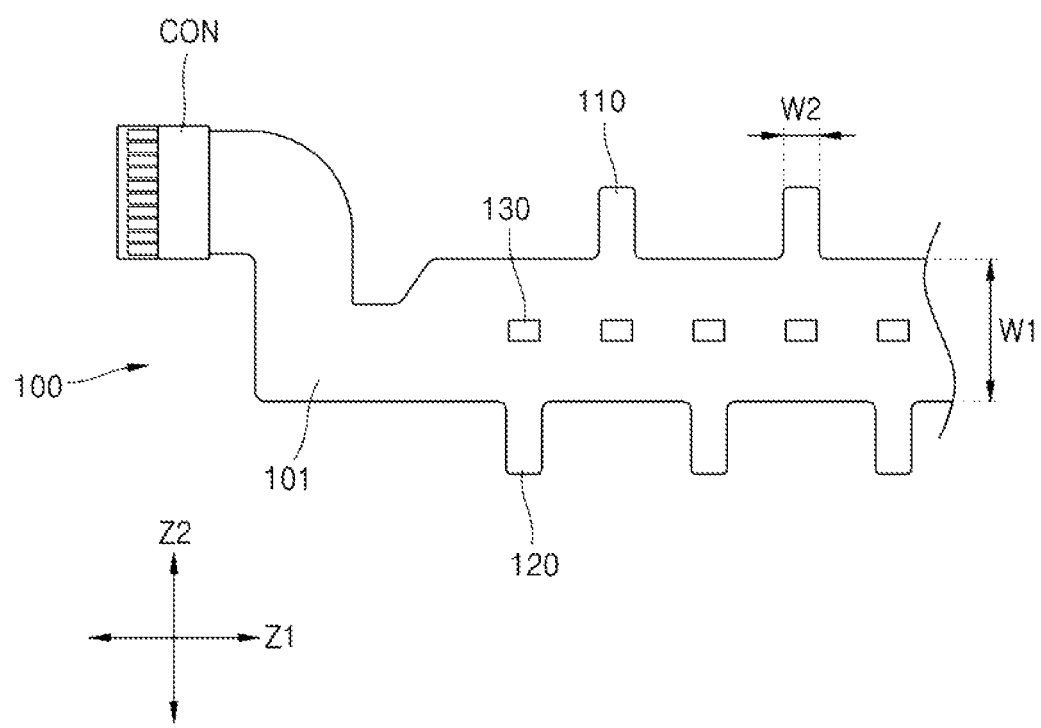
FIG. 5 is a view showing the flexible circuit board of FIG. 4.

FIG. 1 is an exploded perspective view of a battery pack according to an example embodiment. FIG. 2 is a perspective view showing a cell region of FIG. 1. FIG. 3 is a view showing a trajectory of a flexible circuit board that extends across the cell region of FIG. 1. FIG. 4 is a perspective view showing the connection relationship between the flexible circuit board of FIG. 3 and a battery cell. FIG. 5 is a view showing the flexible circuit board of FIG. 4.

Referring to FIGS. 1 and 2, a battery pack according to an embodiment of the present disclosure may include at least one battery cell 10 including a first surface 11 and a second surface 12 forming opposite or both ends along a height or vertical third direction Z3 thereof. The battery cell 10 may include an outer circumferential surface 15 connecting the first surface 11 and the second surface 12. The battery pack may further include a flexible circuit board 100 configured to obtain or detect state information of the battery cell 10. The flexible circuit board 100 may include a main body 101 (meanderingly extending and at least partially surrounding the outer circumferential surfaces 15 of the at least one battery cell 10) and branch portions 110 and 120 (extending from the main body 101 to or onto the first surface 11 or the second surface 12 of the battery cell 10). In an implementation, the meanderingly extending main body 101 may have a corrugated or undulating shape along a length thereof, e.g., when viewed along the third direction Z3.

The battery cell 10 may include the first and second surfaces 11 and 12 forming both or opposite ends thereof (e.g., along the third direction Z3), and the outer circumferential surface 15 connecting the first and second surfaces 11 and 12. In an implementation, first and second electrodes (having different polarities of the battery cell 10) may be formed on or at the first and second surfaces 11 and 12 of the battery cell 10. In an implementation, the first and second surfaces 11 and 12 of the battery cell 10 may refer to top and bottom surfaces along the third direction Z3 of the battery cell 10. The first and second surfaces 11 and 12 of the battery cell 10 may be defined according to positions along the third direction Z3 rather than a definition according to the polarity of the battery cell 10. Depending on the arrangement state of the battery cell 10, the first surfaces 11 of the battery cells 10 adjacent to each other and the second surfaces 12 of the battery cells 10 adjacent to each other may have the same polarity or different polarities. In an implementation, the adjacent battery cells 10 may be arranged in a vertically inverted (e.g., vertically alternating) pattern along the vertical direction Z3. In an implementation, the first surfaces 11 of the battery cells 10 adjacent to each other, and the second surfaces 12 of the battery cells 10 adjacent to each other may have different polarities.

The battery cell 10 may be a battery cell having a circular or cylindrical shape with the outer circumferential surface 15 having a circumferential shape. Throughout the present specification, the outer circumferential surface 15 of the battery cell 10 may refer to a side surface connecting the first and second surfaces 11 and 12 of the battery cell 10, e.g., a side surface of the battery cell 10 having a cylindrical shape. The battery pack may include a plurality of the battery cells 10 arranged in a cell region B (e.g., a cell-containing region of the battery pack). Referring to FIG. 2, the cell region B may refer to a region of the battery pack in which the plurality of battery cells 10 of the battery pack are arranged. The cell region B may correspond to a region surrounded by an (e.g., imaginary or virtual) envelope connecting the outer circumferential surfaces 15 of the (e.g., outermost) battery cells 10 at an edge of the plurality of battery cells 10 of the battery pack in a straight line form or a flat, planar shape (e.g., extending lengthwise along a first direction Z1 and a second direction Z2). In an implementation, the cell region B may have a hexahedral shape including a pair of long side portions S1 extending lengthwise along the first direction Z1 and a pair of short side portions S2 extending lengthwise along the second direction Z2. The battery cells 10 may include a plurality of rows of battery cells 10 extending along the first direction Z1 in the cell region B. Here, the first direction Z1 (of the long side portions S1 of the cell region B) may refer to a direction in which an envelope extends in a longest straight line form or a longest flat, planar shape among sides or envelopes surrounding the cell region B.

The plurality of rows of battery cells 10 may each extend (e.g., lengthwise) along the first direction Z1, and the battery cells 10 of adjacent rows may be arranged to be shifted from or offset relative to each other (e.g., a line connecting centers of the battery cells 10 may have a zigzag shape). In an implementation, one battery cell 10 of one row may be densely arranged or packed between a pair of battery cells 10 of another, adjacent row. The energy density of the battery pack may be increased through the dense arrangement of the battery cells 10, and invalid or dead spaces may be removed or reduced.

Referring to FIG. 1, the battery pack according to an embodiment may include a holder 150 for defining an assembly position of a plurality of the battery cells 10 and structurally binding the plurality of battery cells 10. In an implementation, the holder 150 may include first and second holders 151 and 152 that are assembled to face each other with the battery cells 10 therebetween (e.g., accommodated therein). First and second openings OP1 and OP2 (for exposing at least part of the first and second surfaces 11 and 12 of the battery cells 10) may be in each of the first and second holders 151 and 152, and the first and second surfaces 11 and 12 of the battery cell 10 exposed through the first and second openings OP1 and OP2 or first and second electrodes on the first and second surfaces 11 and 12 may be electrically connected to each other through a tap plate arranged on the first and second holders 151 and 152. An assembly rib R for fixing or holding the battery cells 10 in a proper or desired position by surrounding the outer circumferential surface 15 of the battery cell 10 may be on the first and second holders 151 and 152. A cooling plate 200 may be on at least one of the first and second holders 151 and 152.

Referring to FIGS. 3 through 5, a battery pack according to an embodiment may include the flexible circuit board 100 configured to obtain, sense, or detect state information of a battery cell 10. In an implementation, the flexible circuit board 100 may include the (e.g., corrugated) main body 101 meanderingly extending and at least partially surrounding outer circumferential surfaces 15 of the battery cells 10. In an implementation, the flexible circuit board 100 may include branch portions 110 and 120 extending from the main body 101 onto the first surfaces 11 or the second surfaces 12 of the battery cells 10.

The flexible circuit board 100 may be in the form of a flexible film and may be meanderingly bent (e.g., to have the corrugated or undulating shape) and may extend along outer circumferential surfaces 15 of adjacent battery cells 10. In an implementation, the flexible circuit board 100 may extend along the outer circumferential surfaces 15 of the battery cells 10 that are adjacent to each other and are shifted or offset from each other, and may meanderingly extend to surround part of the outer circumferential surfaces 15 of the battery cells 10. In an implementation, the flexible circuit board 100 may extend along (e.g., between) the battery cells 10 in adjacent rows, may extend along the first direction Z1, and may meanderingly extend along the outer circumferential surfaces 15 of the battery cells in adjacent rows. In an implementation, the main body 101 of the flexible circuit board 100 may extend from one end to another end of the cell region B along the outer circumferential surfaces 15 of the battery cells 10 of one set of adjacent rows and along the first direction Z1, and may extend back from the other end to the one end of the cell region B along the outer circumferential surfaces 15 of the battery cells 10 of another set of adjacent rows, e.g., may be bent in the form of a U-turn from or at the other end of the cell region B. In this way, the flexible circuit board 100 may reciprocate or extend between the one end and the other end of the cell region B in a zigzag form, may extend along the outer circumferential surfaces 15 of the battery cells 10 in adjacent rows, and may collect state information about the plurality of battery cells 10.

In an implementation, the flexible circuit board 100 or the main body 101 of the flexible circuit board 100 may extend along other directions, e.g., other than the first direction Z1. Even in this case, the flexible circuit board 100 or the main body 101 of the flexible circuit board 100 may meanderingly extend along the outer circumferential surfaces 15 of the battery cells that are adjacent to each other and are shifted or offset from each other. In an implementation, the extension direction of the flexible circuit board 100 or the main body 101 of the flexible circuit board 100 may correspond to a direction in which the flexible circuit board 100 or the main body 101 of the flexible circuit board 100 extends across the battery cells 10 of a group to be measured and may extend along the battery cells 10 of the group to be measured and collect state information such as temperature information or voltage information from the outer circumferential surfaces 15 or the first and second surfaces 11 and 12 of the battery cells 10 of the group.

In an implementation, the flexible circuit board 100 or the main body 101 of the flexible circuit board 100 may extend along a temperature gradient direction, e.g., in which the temperature of the battery cells 10 changes, among directions crossing the cell region B. In an implementation, the flexible circuit board 100 may extend along a temperature gradient direction (in which the temperature of the battery cells 10 changes to a maximum), e.g., may extend from cooler battery cells 10 to warmer battery cells 10. In an implementation, when a cooling medium such as external air is supplied to the cell region B, a supply direction of the cooling medium may correspond to a temperature gradient direction, e.g., the temperature gradient direction in which the temperature of the battery cell 10 changes to the maximum. In an implementation, the flexible circuit board 100 or the main body 101 of the flexible circuit board 100 may extend along the temperature gradient direction so that a temperature distribution in the entire cell region B may be easily obtained. In an implementation, whether the supply of the cooling medium is smoothly performed may be monitored in real time, and by monitoring a relatively high temperature region along the temperature gradient direction, abnormal situations such as overheating or explosion in a high temperature region with a high possibility of deterioration may be quickly detected.

The flexible circuit board 100 may include the main body 101 having a relatively large width (see W1 of FIGS. 4 and 5) along the third direction Z3, and a plurality of branch portions 110 and 120 branched or extending from positions spaced apart from each other along the longitudinal or extension direction of the main body 101. In an implementation, the main body 101 of the flexible circuit board 100 may have a relatively large (e.g., first) width (see W1 of FIG. 5), and the branch portions 110 and 120 of the flexible circuit board 100 may have a relatively small (e.g., second) width (see W2 of FIG. 5), e.g., the first width W1 may be greater than the second width W2.

As will be described below, the main body 101 of the flexible circuit board 100 may obtain temperature information of the battery cell 10 from the outer circumferential surface 15 of the battery cell 10, and the branch portions 110 and 120 of the flexible circuit board 100 may obtain voltage information of the battery cell 10 from the first and second surfaces 11 and 12 of the battery cell 10. In an implementation, the main body 101 of the flexible circuit board 100 may be attached to the outer circumferential surface 15 of the battery cell 10. In an implementation, the main body 101 of the flexible circuit board 100 may be attached to the outer circumferential surface 15 of the battery cell 10 by interposing an adhesive member (see A of FIG. 4), e.g., double-sided tape, therebetween.

The branch portions 110 and 120 may be conductively coupled on or to the first and second surfaces 11 and 12 of the battery cells 10. In an implementation, the branch portions 110 and 120 may form conductive bonding with the first and second electrodes formed on or at the first and second surfaces 11 and 12 of the battery cells 10 through thermal bonding such as welding or soldering. As will be described below, the branch portions 110 and 120 may include first and second branch portions 110 and 120 that protrude from opposite ends or sides (in a widthwise direction) of the main body 101 of the flexible circuit board 100. Each of the first and second branch portions 110 and 120 may form conductive bonding with the first and second surfaces 11 and 12 of the battery cells 10.

The main body 101 of the flexible circuit board 100 may obtain temperature information from the outer circumferential surfaces 15 of different battery cells 10 while meanderingly extending along the outer circumferential surfaces of the battery cells 10 that are adjacent to each other. In an implementation, the main body 101 of the flexible circuit board 100 may include a plurality of thermistors 130 spaced apart from each other, along the longitudinal direction of the main body 101. The plurality of thermistors 130 may be chip thermistors that may be directly mounted on the main body 101 of the flexible circuit board 100. In an implementation, the thermistors 130 may be soldered on the main body 101 of the flexible circuit board 100.

With respect to the position of the thermistors 130 spaced apart along the longitudinal direction of the main body 101, the main body 101 of the flexible circuit board 100 may extend along the outer circumferential surfaces 15 of the battery cells 10 that are adjacent to each other, and the thermistors 130 may be arranged at a plurality of locations along the longitudinal direction of the main body 101 to correspond to (e.g., face or contact) the outer circumferential surfaces 15 of the battery cells 10 to be measured. A plurality of thermistors 130 spaced apart from each other, along the longitudinal direction of the main body 101, may correspond to the number of battery cells 10 to be measured and may be at a plurality of locations to correspond to the outer circumferential surfaces 15 of the battery cells 10 to be measured. In an implementation, the numbers or positions of the battery cells 10 to be measured may be different from each other according to the detailed design of the battery pack, and all of the plurality of battery cells that the main body 101 of the flexible circuit board 100 crosses, may be a measurement target, and only some of the battery cells 10 may be selectively set as a measurement target. In an implementation, only some of the battery cells 10 that the main body 101 of the flexible circuit board 100 crosses, may be selectively set as a measurement target.

A plurality of the branch portions 110 and 120 branched from a plurality of locations spaced apart from each other, may be formed or spaced apart along the longitudinal or extension direction of the main body 101. The branch portions 110 and 120 of the flexible circuit board 100 may include the plurality of branch portions 110 and 120 that protrude from each end (e.g., sides in the widthwise direction) of the main body 101 (e.g., opposite sides in the third direction Z3), e.g., one end and the other end forming both ends or sides of the width W1 of the main body 101. In an implementation, the branch portions 110 and 120 may include a plurality of branch portions 110 and 120 protruding from both sides (in the widthwise direction) of the main body 101. The branch portions 110 and 120 may include a first branch portion 110 protruding from one side of the main body 101 and a second branch portion 120 protruding from the other side of the main body 101 (e.g., relative to the third direction Z3 such that the branch portions 110 and 120 are vertically spaced apart in the third direction Z3).

The first branch portion 110 may collect voltage information of the battery cell 10 from the first surface 11 of the battery cell 10, and the second branch portion 120 may collect voltage information of the battery cell 10 from the second surface 12 of the battery cell 10. In an implementation, the first and second branch portions 110 and 120 may protrude from different locations along the longitudinal direction of the main body 101 and may be formed at positions shifted or laterally or vertically offset from each other to collect voltage information from the first and second surfaces 11 and 12 of different battery cells 10, e.g., in positions not corresponding to or aligned with each other along the height direction Z3. In an implementation, the first and second branch portions 110 and 120 may be shifted from or offset relative to each other, along the longitudinal direction of the main body 101. In an implementation, the plurality of battery cells 10 of the battery pack may be connected in series or in parallel with the battery cells 10 that are adjacent to each other. In an implementation, in order to detect the voltage of each battery cell 10, all of voltages having one polarity and the other polarity of the corresponding battery cell 10 may not need to be detected, and the voltage of the adjacent battery cell 10 electrically connected to the other polarity of the battery cell 10 may be detected while detecting a voltage of one polarity of each battery cell 10 so that a voltage between one polarity and the other polarity of the battery cell 10 may be calculated. In an implementation, the first and second branch portions 110 and 120 may be at different positions of or along the main body 101 along the longitudinal direction of the main body 101 so as to measure voltages of different battery cells 10. Accordingly, the first and second branch portions 110 and 120 may be at locations not corresponding to each other along the third direction Z3 (e.g., the first and second branch portions 110 and 120 may not be vertically aligned along the third direction Z3).

The first and second branch portions 110 and 120 may extend to or onto the first and second surfaces 11 and 12 of the battery cell 10 while protruding from sides of the main body 101 (extending along the outer circumferential surfaces 15 of the battery cells 10) and may be connected to the first and second electrodes on or at the first and second surfaces 11 and 12 of the battery cells 10 while being bent on the first and second surfaces 11 and 12 of the battery cell 10. In an implementation, the first and second branch portions 110 and 120 may be bent on or onto the first and second surfaces 11 and 12 of the battery cell 10 from the main body 101 or may protrude from the main body 101 in opposite directions along the height direction Z3, and may be electrically connected to the first and second electrodes formed on the first and second surfaces 11 and 12 of the battery cell 10 so as to detect voltages of the first and second electrodes.

The flexible circuit board 100 may extend across the plurality of battery cells 10 of the battery pack, and may collect state information from the battery cell 10 and may transmit the collected state information to a battery management system (BMS). In an implementation, the flexible circuit board 100 may collect temperature information of the battery cell 10 through the thermistors 130 at a plurality of locations on the main body 101 along the longitudinal direction and may collect voltage information of the battery cell 10 through the plurality of branch portions 110 and 120 protruding from the main body 101 onto the first and second surfaces 11 and 12 of the battery cell 10. In an implementation, the state information such as the temperature information and the voltage information collected from the plurality of battery cells 10 across which the flexible circuit board 100 extends, may be transmitted to the BMS. In an implementation, the BMS may be in the form of a rigid circuit board, unlike the flexible circuit board 100 flexibly formed in the form of a film. In an implementation, a connector (see CON of FIG. 5) for electrical connection with a BMS may be at one end along the longitudinal direction of the flexible circuit board 100, and the voltage information and the temperature information regarding the plurality of battery cells 10 collected through the flexible circuit board 100 may be transmitted to the BMS through the connector (see CON of FIG. 5) at one end of the flexible circuit board 100.

The BMS may control charging and discharging operations of the battery cell 10 based on the state information collected from the flexible circuit board 100, may detect abnormal situations such as overheating, overcharging, and overdischarging, and may take a protection operation such as stopping the charging and discharging operations of the battery cell 10.

In a battery pack according to the present disclosure, state information of a battery cell may be easily obtained through a flexible circuit board that extends across a plurality of battery cells and collects different types of state information such as temperature and voltage of the plurality of battery cells together, and may accurately obtain the state information of the battery cell through a simple structure, thereby recognizing an abnormal situation of the battery cell and quickly performing a protection operation in response to the abnormal situation.

One or more embodiments may provide a battery pack in which, while extending across a plurality of battery cells, state information of a battery cell may be easily obtained through a flexible circuit board that collects different types of state information such as temperature and voltage of the plurality of battery cells together.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A battery pack, comprising:
   at least one battery cell including:
     a first surface and a second surface forming opposite ends along a height direction thereof, and
     an outer circumferential surface connecting the first surface and the second surface; and
   a circuit board configured to obtain temperature information or voltage information of the at least one battery cell, the circuit board including:
     a curved corrugated main body conformally surrounding at least a part of the outer circumferential surface of the at least one battery cell, and
     branch portions extending from the main body onto the first surface or the second surface of the at least one battery cell,
   wherein:
   the branch portions protrude from at least one side of the main body onto the first surface or the second surface of the at least one battery cell,
   the branch portions include:
     a plurality of first branch portions spaced apart from each other and protruding from one side of the main body onto the first surface of the at least one battery cell; and
     a plurality of second branch portions spaced apart from each other and protruding from another side of the main body onto the second surface of the at least one battery cell, and
   each of the first and second branch portions are configured to obtain the voltage information of the at least one battery cell from the first surface or the second surface of the at least one battery cell.

2. The battery pack as claimed in claim 1, wherein:
   the at least one battery cell includes a plurality of battery cells, and
   the corrugated main body of the circuit board:
     extends along outer circumferential surfaces of adjacent ones of the plurality of battery cells, and
     is configured to obtain the temperature information from the outer circumferential surfaces of the plurality of battery cells.

3. The battery pack as claimed in claim 1, wherein the circuit board includes a plurality of thermistors spaced apart from each other along an extension direction of the main body.

4. The battery pack as claimed in claim 1, wherein the first and second branch portions are laterally offset from each other along an extension direction of the main body.

5. The battery pack as claimed in claim 1, wherein the first and second branch portions are vertically offset from each other.

6. The battery pack as claimed in claim 1, wherein the at least one battery cell includes a plurality of rows of battery cells that each extend lengthwise along a direction of long sides of a cell-containing region of the battery pack.

7. The battery pack as claimed in claim 6, wherein battery cells in adjacent rows are offset relative to each other.

8. The battery pack as claimed in claim 6, wherein the corrugated main body of the circuit board extends along outer circumferential surfaces of battery cells in adjacent rows and between opposite ends of the cell-containing region of the battery pack.

9. The battery pack as claimed in claim 6, wherein the main body of the flexible circuit board:
   extends from a first end to a second end of the cell-containing region of the battery pack along outer circumferential surfaces of the battery cells in two adjacent rows,
   extends back from the second end to the first end of the cell-containing region of the battery pack along outer circumferential surfaces of the battery cells in two other adjacent rows, and
   is bent in the form of a U-turn at the second end of the cell-containing region of the battery pack.

10. The battery pack as claimed in claim 6, wherein the main body of the circuit board extends along the direction of long sides of the cell-containing region of the battery pack.

11. The battery pack as claimed in claim 10, wherein the cell-containing region of the battery pack is a region surrounded by an imaginary planar-sided envelope connecting the outer circumferential surfaces of the battery cells at an outer edge of the plurality of battery cells.

12. The battery pack as claimed in claim 11, wherein the direction of long sides of the cell-containing region of the battery pack is an extension direction of imaginary planar-sided envelope surrounding the cell-containing region of the battery pack extending in a longest straight line form among imaginary planar sides of the envelope surrounding the cell-containing region.

13. The battery pack as claimed in claim 6, wherein the main body of the circuit board extends along a temperature gradient direction in which the temperature of the battery cell changes, among directions crossing the cell-containing region of the battery pack.

14. The battery pack as claimed in claim 13, wherein the main body of the circuit board extends along a temperature gradient direction in which the temperature of the battery cell changes to a maximum.

15. The battery pack as claimed in claim 1, wherein the main body of the circuit board is attached onto the outer circumferential surface of the battery cell with an adhesive member therebetween.

16. The battery pack as claimed in claim 15, wherein the adhesive member includes a double-sided tape.

* * * * *